United States Patent [19]

Oshimi et al.

[11] Patent Number: 5,336,752
[45] Date of Patent: Aug. 9, 1994

[54] METHOD FOR PRODUCING PHENOLIC RESIN

[75] Inventors: Fumiaki Oshimi; Susumu Kubota; Masami Enomoto; Yutaka Otsuki, all of Yokohama, Japan

[73] Assignee: Nippon Oil Co., Ltd., Tokyo, Japan

[21] Appl. No.: 10,603

[22] Filed: Jan. 28, 1993

[30] Foreign Application Priority Data

Jan. 31, 1992 [JP] Japan .................. 4-017110

[51] Int. Cl.$^5$ ...................... C08G 63/78; C08G 63/87
[52] U.S. Cl. ...................... 528/205; 528/212; 528/214; 568/718; 568/719; 568/721; 568/749
[58] Field of Search ...................... 528/205, 212, 214; 568/718, 719, 721, 749

[56] References Cited

U.S. PATENT DOCUMENTS

| | | | |
|---|---|---|---|
| 2,838,474 | 6/1958 | Meis et al. | 528/205 |
| 2,864,868 | 12/1958 | Bader | 528/205 |
| 3,625,874 | 12/1971 | Cottman et al. | 528/205 |
| 4,056,513 | 11/1977 | Lahourcade et al. | 528/205 |
| 4,927,905 | 5/1990 | Bogan | 528/205 |

*Primary Examiner*—John Kight, III
*Assistant Examiner*—Richard Jones
*Attorney, Agent, or Firm*—Darby & Darby

[57] ABSTRACT

A method is provided for producing a phenolic resin represented by the formula (I)

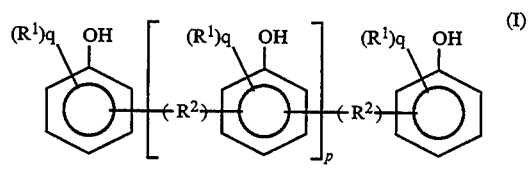

wherein $R^1$ is a hydrogen atom or an alkyl group having 1 to 4 carbon atoms, $R^2$ is a divalent cyclic hydrocarbon residue having 5 to 18 carbon atoms, p is a number of from 0 to 10 and q is a number of 1 or 2. The method involves reacting a phenol with an unsaturated cyclic hydrocarbon compound having two or more carbon-carbon double bonding in the presence of an acid catalyst; and processing a resulting reaction product by a hydrotalcite compound represented by the formula (II)

$$M_{1-x}^{2+}M_x^{3+}(OH)_{2+x-ny}A_y^{n-}\cdot m(H_2O) \qquad (II)$$

where $M^{2+}$ is a divalent, magnesium ion, a divalent zinc ion, a divalent calcium ion, a divalent nickel ion, a divalent cobalt ion, a divalent manganese ion or a divalent copper ion, $M^{3+}$ is a trivalent aluminum ion, a trivalent iron ion or a trivalent chromium ion, $A^{n-}$ is $HCO_3^-$, $CO_3^{2-}$ or $OH^-$, and x, y and m each are $0.1<x<0.5$, $0.1<y<0.4$ and $0\leq m<1$.

13 Claims, No Drawings

METHOD FOR PRODUCING PHENOLIC RESIN

BACKGROUND OF THE INVENTION

This invention relates to a method for producing in high purity a phenolic resin which is superior in thermal resistance, resistance to solvents, acid proofness, moisture proofness and electrical properties and which may be employed satisfactorily as an encapsulating material for semiconductor chips or packages or as a starting material for preparation of printed circuit substrates.

Recently, with a rapid progress in scientific technology, centered about electronic industry, the demand on various products and the starting materials therefor has become more strict. Above all, the progress in the field of the semiconductor-related technology is outstanding such that the degree of integration of semiconductor memory devices has become higher. In keeping therewith, the tendency towards miniaturization of interconnect, ion and a larger chip size, and transition of the packaging method from through-hole packaging to surface packaging is predominant. However, in an automated surface packaging line, problems are presented in that semiconductor packages undergo rapid changes in temperature during soldering of lead wires such that; molded parts of the resin used for encapsulation of semiconductor chips are susceptible to cracking to deteriorate the interface between the lead wire resins to lower the moisture proofness of the semiconductor packages.

With a view to obviating the lowering in moisture proofness of the semiconductor packages, a method has been proposed for increasing the degree of filler packing by changing the filler shape. However, such method suffers from the problem that the elastic modulus of the resin is increased so that cracking tends to be incurred by thermal impact. For reducing the thermal impact on immersion or the semiconductor packages in a soldering bath, a method has been proposed for modifying the resin composition by addition of silicone compounds to the resin, or addition of a thermoplastic oligomer or by silicone modification. However, with these methods, molded products tend to be cracked after immersion in the soldering hath, such that a reliable resin composition semiconductor encapsulation cannot be produced.

Meanwhile, phenolic resins are employed in the resin composition for semiconductor encapsulation as a curing agent for the epoxy resin. As such phenolic resins, novolak phenol resins or novolak cresol resins are employed. However, the phenolic resins lead to strong hygroscopic properties of semiconductor packages, as a result of which the above-mentioned cracking is inevitably produced on immersion of the semiconductor packages in the soldering bath.

For improving thermal resistance of the resin composition for semiconductor encapsulation, attempts have recently been made for improving the phenolic resin which is used as a curing agent for the epoxy resins. For example, in Japanese Laid-Open Patent Publication No. 3-66919 (1991), a phenol resin has been proposed which may be produced by reacting phenols with unsaturated polycyclic hydrocarbon compounds having two or more carbon-carbon double bonds, and a report has also been made that the aforementioned problems may be overcome by employing the phenol resin as a curing agent.

After the end of the reaction, acid catalysts or catalyst residues used for the reaction need to be removed completely because otherwise the resin composition for semiconductor encapsulation or the resin composition for laminated sheets containing the produced phenol resin tends to be lowered in their properties.

Although a method is known for washing the reaction liquid with water for complete removal of the acid catalyst or the catalyst residues during the preparation of the phenolic resin, this method is not useful in that the separation efficiency between the organic layer and the water layer after washing and the yield of the ultimate product are low and complex and labor-consuming operation and related equipment are required in disposal of the separated water layer and waste water.

Although there is known a method of washing the reaction liquid with an alkaline aqueous solution, this method is also not satisfactory in improving the separation efficiency between the oil layer and the water layer. Besides, the alkalis tend to produce colloidal hydroxide precipitates such that by-produced difficultly filterable precipitates need to be separated by an additional separating process.

SUMMARY OF THE INVENTION

It is an object of the present invention to provide a method for producing a phenol resin comprising reacting phenols with an unsaturated cyclic hydrocarbon compound having two or more carbon-carbon double bonds, according to which acid catalysts or catalyst residues may be removed from the reaction product easily completely to produce the phenol resin having high purity in industrial scale.

It is another object of the present invention to provide method for producing a phenolic resin which may be advantageously employed for products such as resins for semiconductors, laminated sheets for printed circuit substrates, powder paints or brake shoes, and which is capable of affording excellent moisture proofness and electrical properties to these products.

The above and other objects of the present invention will become apparent from the following description.

According to the present invention, there is provided a method for producing a phenolic resin represented by the formula (I)

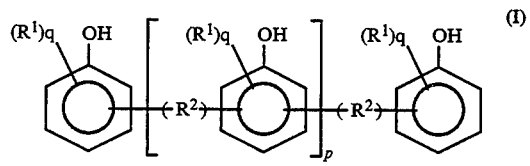

wherein $R^1$ is a hydrogen atom or an alkyl group having 1 to 4 carbon atoms, $R^2$ is a divalent cyclic hydrocarbon residue having 5 to 18 carbon atoms, p is a number of from 0 to 10 and q is a number of 1 or 2, the method comprising:

reacting a phenol with an unsaturated cyclic hydrocarbon compound having two or more carbon-carbon double bonds in the presence of an acid catalyst, and processing a resulting reaction product by a hydrotalcite compound represented by the formula (II)

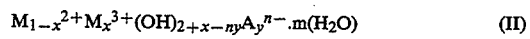

$$M_{1-x}^{2+}M_x^{3+}(OH)_{2+x-ny}A_y^{n-}\cdot m(H_2O) \quad (II)$$

where $M^{2+}$ is a divalent magnesium ion, a divalent zinc ion, a divalent calcium ion, a divalent nickel ion, a divalent cobalt ion, a divalent manganese ion or a divalent copper ion, $M^{3+}$ is a trivalent aluminum ion, a trivalent iron ion or a trivalent chromium ion, $A^{n-}$ is $HCO_3^-$, $CO_3^{2-}$ or $OH^-$, and x, y and m each are $0.1<x<0.5$, $0.1<y<0.4$ and $0 \leq m<1$.

PREFERRED EMBODIMENTS OF THE INVENTION

The present invention will be explained in more detail hereinbelow.

The method for producing the phenolic resin according to the present invention involves reacting a phenol with an unsaturated cyclic hydrocarbon compound having two or more carbon-carbon double bonds, referred to hereinafter as a hydrocarbon (I).

The phenol is represented by the formula (III)

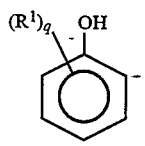
(III)

wherein $R^1$ is a hydrogen atom or an alkyl group having 1 to 4 carbon atoms and q is 1 or 2, and may include phenol, o-cresol, m-cresol, p-cresol, t-butyl phenol, 2, 4-dimethyl phenol and 2, 6-dimethyl phenol. Above all, phenol, cresol and xylenol are preferred in view of characteristics of the product resin, ease of purification or economy. These may be used singly or in combination.

It is preferred that the number of carbon atoms in the hydrocarbon (1) be in a range of 5 to 16. Examples of these hydrocarbons (1) include Diels-Alder reaction products of conjugated chain diene compounds such as butadiene, isoprene or piperylene; cyclic conjugated compound such as cyclopentadiene or methyl cyclopentadiene and mixtures thereof. Examples of the Diels-Alder reaction products preferably include, for example,

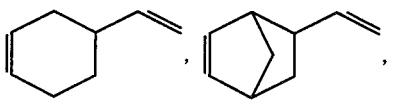

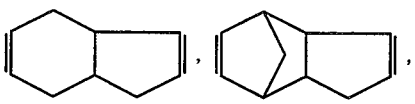

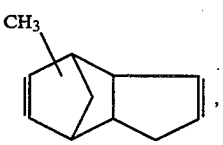

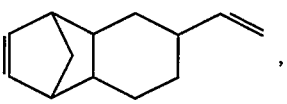

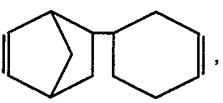

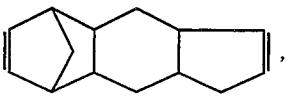

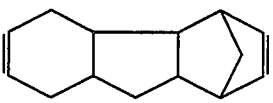

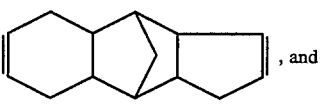, and

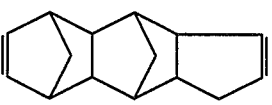

These may be used singly or in combination, as desired.

The above-mentioned Diels-Alder reaction products are the compounds which are intermediate feed materials or by-products in a manufacture plant for 5-ethylidene norbornene, i.e. a third component of ethylene propylene diene methylene rubber (EPDM). These are feed materials available industrially at lower costs.

Preferably, the charging ratio of the phenol to hydrocarbon (1) may usually be 0.8 to 12 mol equivalents, preferably 1 to 8 mol equivalents, of phenol to 1 mol equivalent of the hydrocarbon (1). If the charging ratio of the phenol is less than 0.8 mol equivalent, the reaction may undesirably be accompanied by homopolymerization of the hydrocarbon (1), whereas if it exceeds 12 mol equivalents, it may become undesirably difficult to recover unreacted phenol.

As the acid catalyst employed in reacting the phenol with the hydrocarbon (1), boron trifluoride; boron trifluoride complexes such as ether complexes, water complexes, amine complexes, phenol complexes or alcohol complexes of boron trifluoride; aluminum compounds such as aluminum trichloride or diethyl aluminum monochloride; iron chloride; titanium tetrachloride; sulfuric acid; hydrogen fluoride or trifluoromethane sulfonic acid, may preferably be employed. Boron trifluoride and boron trifluoride complexes are more preferably employed. Boron trifluoride and boron trifluoride-phenol complexes are most preferred.

There is no particular limitation to the amount of the acid catalyst which may be selected suitably depending on the type of the catalysts employed. If the catalyst is a boron trifluoride-phenol complex, it is preferably used in an amount of 0.1 to 20 parts by weight and more preferably 0.5 to 10 parts by weight to 100 parts by weight of the hydrocarbon (1).

The reaction between the phenol and the hydrocarbon (1) may be carried out with or without the use of a solvent. If the solvent is not used, the phenol may be used in an amount preferably in excess of a molar equivalent and more preferably 3 to 12 molar equivalents to a molar equivalent of the hydrocarbon (1). Although there is no particular limitation to the solvent used if it is not obstructive to the reaction, aromatic hydrocarbon compounds such as benzene, toluene or xylene, may be used most advantageously as the solvent.

The reaction temperature is set depending on the type of the catalysts employed and is usually set in a range of 20° to 170° C. and preferably in a range of 50° to 150° C., if the boron trifluoride-phenol complex, for example is employed. If the reaction temperature exceeds 170° C., catalyst decomposition or secondary reaction may undesirably occur, whereas if the reaction temperature is lower than 20° C., the reaction may take a prolonged time with economic demerits.

For carrying out the above reaction smoothly, it is preferred to diminish the moisture in the reaction system to as low a level as possible. Above all, it is preferred to maintain the moisture in the system so as to be not higher than 100 weight ppm. For the sake of preventing homopolymerization of the hydrocarbon (1) and controlling the heat of reaction, it is preferred to carry out the polymerization reaction as the hydrocarbon (1) is progressively added to the reaction system.

In the method for producing the phenolic resin according to the present invention, the resulting reaction product is processed after termination of the reaction with a particular hydrotalcite compound, referred to hereinafter as hydrotalcite (A).

The above-mentioned hydrotalcites (A) are represented by the formula (II)

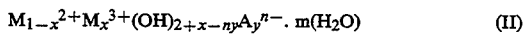
$$M_{1-x}^{2+}M_x^{3+}(OH)_{2+x-ny}A_y^{n-} \cdot m(H_2O) \quad (II)$$

where $M^{2+}$ is a divalent magnesium ion, a divalent zinc ion, a divalent calcium ion, a divalent nickel ion, a divalent cobalt ion, a divalent manganese ion or a divalent copper ion, $M^{3+}$ is a trivalent aluminum ion, a trivalent iron ion or a trivalent chromium ion, $A^{n-}$ is $HCO_3^-$, $CO_3^{2-}$ or $OH^-$, and x, y and m each are $0.1 < x < 0.5$, $0.1 < y < 0.4$ and $0 \leq m < 1$. Examples of the hydrotalcites include $Mg_{0.7}Al_{0.3}(OH)_{2.3} \cdot 0.5\ H_2O$, $Mg_{0.67}Al_{0.33}(OH)_{2.33} \cdot 0.52\ H_2O$, $Zn_{0.75}Al_{0.25}(OH)_2(CO_3)_{0.125} \cdot 0.5\ H_2O$ and $Mg_{0.7}Al_{0.3}(OH)_2(CO_3)_{0.15} \cdot mH_2O$, where $0.46 \leq m \leq 0.54$. Commercially available products such as those sold by Kyowa Chemical Industry Co., Ltd. under a trade name of "KW-1000", may also be employed. There is no particular limitation to the method for producing the hydrotalcite (A) which may be prepared by, for example the method disclosed in Japanese Patent Publication No. 52-3353. Specifically, the hydrotalcite may be prepared by reacting (a) metal compounds such as halogenides, nitrates, sulfates, organic acid salts, alcoholates, alkali metal aluminum salts, hydroxides, basic carbonates, carbonates, basic organic acid salts or oxides of divalent magnesium ions, divalent zinc ions, divalent calcium ions, divalent nickel ions, divalent cobalt ions, divalent manganese ions or divalent copper ions, (b) metal compounds such as halogenides, nitrates, sulfates, organic acid salts, alcoholates, alkali metal aluminum salts, hydroxides, basic carbonates, carbonates, basic organic acid salts on oxides of trivalent aluminum ions, trivalent iron ions or trivalent chromium ions, (c) compounds capable of forming $HCO_3^-$, $CO_3^{2-}$ or $OH^-$ in a liquid solvent, specifically anionic compounds such as sodium hydrogen carbonate, potassium hydrogen carbonate, sodium carbonate, potassium carbonate, ammonium carbonate, sodium hydroxide, potassium hydroxide, ammonia, urea or calcium hydroxide, and (d) a substance yielding $OH^-$ such as alkali metals, alkaline earth metals or oxides thereof, hydroxides, carbonates, ammonium hydroxide or an ammonia gas, in a solvent, preferably an aqueous solvent, under sufficient agitation, so that x and y in the formula (II) are $0.1 < x < 0.5$ and $0.1 < y < 0.4$. The reaction system may preferably be set so that pH is not less than 6 and the pressure is usually in a range of from atmospheric pressure to 300 atmospheres. The reaction temperature may preferably be 350° C. or less and, above all, in a range of from 0° to 350° C. However, the reaction temperature may be suitably selected depending on solubility of the reactants in the solvent. If the reactants are low in solubility, it is effective to heat the reaction system within a range of from 60° to 350° C. The reaction time may be suitably selected depending on the reactants employed and is usually in a range of from 30 minutes to 15 hours.

After termination of the reaction, the precipitates may be collected and dried to obtain the desired hydrotalcite (A).

For accelerating the crystallization of the hydrotalcite (A) during the above-mentioned manufacture process, a slurry of the products in an aqueous solvent may be heated and processed by hydrothermal treatment, preferably at the reaction temperature of 150° to 350° C. and reaction pressure of 5 to 300 atmospheres and for 5 to 15 hours under conditions of sufficient agitation.

Under a non-aqueous condition, the above-mentioned hydrotalcite (A) is capable of capturing halogen components in the reaction solution by anionic exchange reaction and neutralizing the acid catalysts. Besides, the hydrotalcite (A) is substantially insoluble in oil or in water. In addition, the hydrotalcite (A) which have adsorbed the acid catalysts are superior in precipitation and in filtration characteristics and hence may be separated easily after processing the reaction product so that substances yielded after the processing are not left in the reaction product to enable a high purity phenolic resin to be produced without lowering the electrical insulating properties of the produced phenolic resin.

Although there is no limitation in the processing conditions in processing the reaction product produced by reacting the phenol with the hydrocarbon (1) in the presence of the above-mentioned acid catalyst, using the above-mentioned hydrotalcite (A), since the processing reaction proceeds at an extremely high rate, it is preferred to carry out the processing reaction by heating and agitation under moderate processing conditions, such as the processing temperatures of 10° to 150° C., preferably 30° to 90° C. and the processing duration of 10 minutes to 10 hours, preferably 20 minutes to 5 hours. It is possible by such processing to cause the acid catalyst or the catalyst residues to be sufficiently deactivated and adsorbed for removal.

The proportion of the hydrotalcite (A) employed may be suitably selected depending on the types of the acid catalysts and the adsorption capacity of the hydrotalcite (A) employed, and is usually 0.5 to 10 times by weight that of the catalyst. Specifically, if hydrotalcite "KW-1000" manufactured by Kyowa Chemical Industry Co., Ltd. is employed as the hydrotalcite (A) and a boron fluoride-phenol complex catalyst is employed as an acid catalyst, the hydrotalcite (A) may be usually employed in an amount of 1 to 8 times that of the catalyst.

In the method of the present invention, the acid catalyst is deactivated and adsorbed by the hydrotalcite (A) and the hydrotalcite (A) which have adsorbed the acid catalyst are filtered off and removed, after which a reaction solution completely freed of the catalyst residues is recovered and distilled for condensation to produce the ultimate phenolic resin with a high purity.

During the filtering process, it is possible to add a solvent or to raise the temperature of the filtrate for improving the operability.

The phenolic resin obtained is a phenolic resin represented by the formula (I)

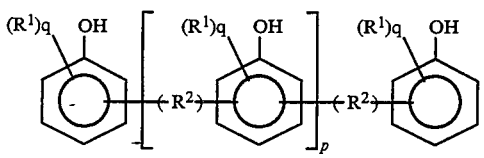

wherein $R^1$ is a hydrogen atom or an alkyl group having 1 to 4 carbon atoms, $R^2$ is a divalent cyclic hydrocarbon residue having 5 to 18 carbon atoms, p is a number of from 0 to 10 and q is a number of 1 or 2, and may be enumerated by

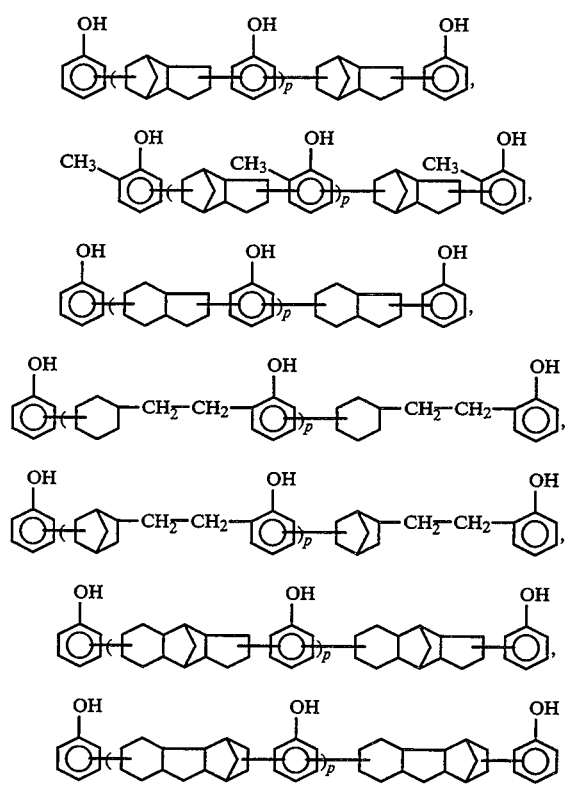

where p is a number from 0 to 10, and mixtures thereof.

By processing with the hydrotalcite (A) in the method for producing the phenolic resin in accordance with the present invention, the ultimate phenolic resin is completely freed of halogen atom ions or catalyst residues, so that the cured phenolic resin product is excellent in electrical properties. Besides, the phenolic resins obtained by the method of the present invention is low in hygroscopic properties so that the resultant cured product is excellent in moisture proofness and may be advantageously employed as a resin for encapsulation of semiconductor packages, laminated sheets for printed circuit substrates, powder paint or brake shoes.

EXAMPLES OF THE INVENTION

The present invention is explained with reference to Examples and Comparative Examples, which are given only for illustration and are not intended for limiting the invention.

EXAMPLE 1

1500 g of phenol and 300 g of toluene were charged in a reaction vessel of 5 lit. capacity equipped with a reflux cooler and a Liebig condenser. The reaction system was heated to 170° C. to distill off 250 g of toluene so that the moisture in the reaction system was 60 ppm. The reaction system was cooled to 80° C. and 12 g of a boron trifluoride-phenol complex were added to the system. The reaction temperature was controlled to 80° C. and 300 g of dicyclopentadiene with a moisture content of 20 ppm were added gradually dropwise over 2.5 hours. After completion of the dropwise addition, the reaction was carried out at 80° C. for 0.5 hour.

After termination of the reaction, 36 g of a magnesium compound having the formula $Mg_{0.7}Al_{0.3}(OH)_2 \cdot (CO_3)_{0.15} \cdot mH_2O$ where $0.46 \leq m \leq 0.54$, manufactured by Kyowa Chemical Industry Co., Ltd. under the trade name of "KW-1000", as the hydrotalcite, were added to the reaction product from the above reaction. The catalyst was deactivated by agitation for 30 minutes. The reaction solution was filtered through a filter paper overlaid with sellaite. The resulting transparent filtrate was distilled in vacuum at 240° C. 560 g of the phenolic resin represented by the formula

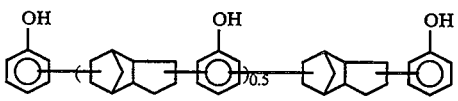

were produced. The following are the results of various analyses conducted on the product.

The produced phenolic resin had a softening point of 96° C., a Gardener color hue of 7, residual boron content of 5 ppm and fluorine content of not more than 1 ppm.

After acetylation with acetic anhydride, the content of the phenolic hydroxyl groups was found by back titration. In this manner, the phenolic hydroxyl group equivalent was found to be 173.

$^1$H-NMR analyses have revealed that protons coupled to the aromatic ring were observed at $\sigma$6.5 to 7.5 ppm and protons of a naphthene ring were observed at $\sigma$0. 8 to 2.5 ppm, while proton absorption due to carbon-carbon double bond was not observed. The content of the phenolic hydroxyl groups was found from a peak area ratio of $\sigma$6.5 to 8 ppm to $\sigma$0.8 to 2.5 ppm. It was found in this manner that the phenolic hydroxyl group equivalent was 173, which coincided with the results as found by back titration.

On the other hand, since the signal of the carbon of 158 ppm produced on ether addition of phenols to the carbon-carbon double bond was not observed by the $^{13}$C-NMR analyses, it was confirmed that the phenols were added by alkylation. The GPC analyses revealed that the number average molecular weight of the phenolic resin was 430.

EXAMPLE 2

The reaction was carried out in the same way as in Example 1 except using 1600 g of o-cresol in place of phenol to produce 570 g of the phenolic resin represented by the formula:

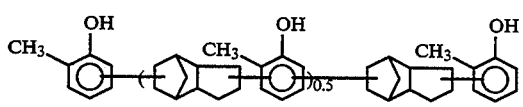

The produced phenolic resin had a softening point of 92° C., a Gardener color hue of 7, a residual boron content of 5 ppm and a fluorine content of 1 ppm or less. The phenolic hydroxyl group equivalent was 180. $^1$H-NMR analyses revealed that there occurred no proton absorption due to the carbon-carbon double bond. The content of the phenolic hydroxyl groups was found from the peak area ratio. The phenolic hydroxyl group equivalent was found to be 180, which coincided with the result obtained by back titration. The number average molecular weight of the phenolic resin, as found by GPC analyses, was 470.

EXAMPLE 3

1600 g of phenol and 300 g of toluene were charged in a reaction vessel of 5 lit. capacity equipped with a reflux cooler and a Liebig condenser. The reaction system was heated to 170° C. to distill off 250 g of toluene so that the moisture in the reaction system was 70 ppm. The reaction system was cooled to 80° C. and 25 g of a boron trifluoride-phenol complex were added to the system. 400 g of tetrahydroindene with a moisture content of 20 ppm were added gradually dropwise over 2 hours as the reaction temperature was controlled to be 80° C. After completion of the dropwise addition, the reaction was carried out at 140° C. for 3 hours.

After termination of the reaction, 75 g of a magnesium compound similar to the hydrotalcite compound employed in Example 1 were added to the reaction product. After deactivating the catalyst by agitation continuing for 30 minutes, the reaction solution was filtered using a filter paper overlaid with sellaite. The resulting transparent filtrate was distilled in vacuum at 230° C. to produce 410 g of the phenolic resin represented by the formula:

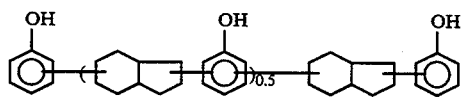

The resulting phenolic resin had a softening point of 105° C., a hydroxyl group equivalent of 195, a Gardener color hue of 8, a residual boron content of 7 ppm and a fluorine content of 1 ppm or less.

EXAMPLE 4

The reaction was carried out in the same way as in Example 3 except using vinyl cyclohexene in place of tetrahydroindene to produce 390 g of the phenolic resin represented by the formula:

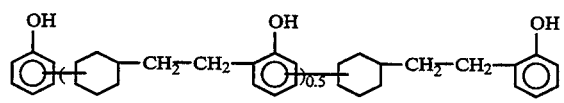

The produced phenolic resin had a softening point of 104° C., a Gardener color hue of 8, a residual boron content of 6 ppm, a fluorine content of 1 ppm or less and a phenolic hydroxyl group equivalent of 196.

EXAMPLE 5

The reaction was carried out in the same way as in Example 3 except using vinyl norbornene in place of tetrahydroindene to produce 380 g of the phenolic resin represented by the formula:

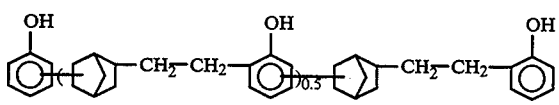

The produced phenolic resin had a softening point of 109° C., a Gardener color hue of 8, a residual boron content of 9 ppm, a fluorine content of 1 ppm or less and a phenolic hydroxyl group equivalent of 200.

EXAMPLE 6

The reaction was carried out in the same way as in Example 3 except using 300 g of a Diels-Alder reaction product between butadiene and dicyclopentadiene in place of tetrahydroindene to produce 560 g of the phenolic resin represented by the formulas:

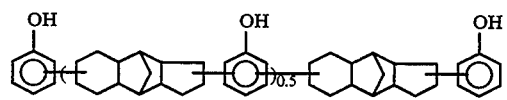

and

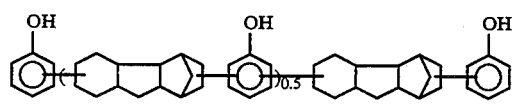

The produced phenolic resin had a softening point of 115° C., a Gardener color hue of 8, a residual boron content of 9 ppm, a fluorine content of 1 ppm or less, and a phenolic hydroxyl group equivalent of 205.

COMPARATIVE EXAMPLE 1

The reaction and processing were carried out in the same way as in Example 1 except deactivating the catalyst by addition of high activity magnesium oxide manufactured by Kyowa Chemical Industry Co., Ltd. under a trade name of "KYOWAMAG-150" (magnesium oxide) in place of the hydrotalcite compound. 560 g of the phenolic resin having the same structure as that of the phenolic resin obtained in Example 1 were produced.

The produced phenolic resin had a softening point of 96° C., a Gardener color hue of 7, a residual boron content of 400 ppm, a fluorine content of 90 ppm, and a phenolic hydroxyl group equivalent of 173.

COMPARATIVE EXAMPLE 2

The reaction and processing were carried out in the same way as in Example 1 except deactivating the catalyst by addition of 250 g of calcium hydroxide manufactured by KISHIDA CHEMICAL CO., LTD. in place of the hydrotalcite compound. 540 g of the phenolic resin having the same structure as that of the phenolic resin obtained in Example 1 were produced.

The produced phenolic resin had a softening point of 96° C., a Gardener color hue of 7, a residual boron content of 300 ppm, a fluorine content of 70 ppm, and a phenolic hydroxyl group equivalent of 173.

COMPARATIVE EXAMPLE 3

The reaction product obtained in Example 1 was dissolved in 3500 g of methylisobutylketone. 1150 g of a 2 wt % aqueous solution of sodium hydroxide were added to the resulting reaction product solution and agitated for two hours for deactivating the catalyst. Then, after the solution was left for two hours, the solution was washed three times with water to recover the organic layer. The solvent was then distilled off to produce the phenolic resin having a structure similar to that of the phenolic resin produced in Example 1. However, since it was difficult to separate the organic layer from the aqueous layer at the stage of recovering the organic layer, only 380 g of the desired phenolic resin were produced because of loss of a large quantity of the desired product. In addition, the phenolic resin had a higher color hue (11 in terms of the Gardener color hue) and exhibited turbidity.

The sodium content, boron content and fluorine content in the phenolic resin were 750 ppm, 600 ppm and 120 ppm, respectively, Although the present invention has been described with reference to the preferred examples, it should be understood that various modifications and variations can be easily made by those skilled in the art without departing from the spirit of the invention. Accordingly, the foregoing disclosure should be interpreted as illustrative only and is not to be interpreted in a limiting sense. The present invention is limited only by the scope of the following claims.

What is claimed is:

1. A method for producing a phenolic resin represented by the formula (I)

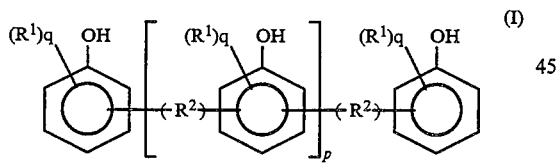

(I)

wherein $R_1$ is a hydrogen atom or an alkyl group having 1 to 4 carbon atoms, $R_2$ is a divalent cyclic hydrocarbon residue having 5 to 18 carbon atoms, p is a number of from 0 to 10 and q is a number of 1 or 2, said method comprising:
 reacting a phenol with an unsaturated cyclic hydrocarbon compound having two or more carbon-carbon double bonds in the presence of an acid catalyst; and
 processing the resulting phenolic resin product and acid catalyst by a hydrotalcite compound represented by the formula (II) to deactivate said acid catalyst $$M_{1-x}^{2+}M_x^{3+}(OH)_{2+x-ny}A_y^{n-}\cdot m(H_2O)$$ (II)

where $M^{2+}$ is a divalent magnesium ion, a divalent zinc ion, a divalent calcium ion, a divalent nickel ion, a divalent cobalt ion, a divalent manganese ion or a divalent copper ion, $M^{3+}$ is a trivalent aluminum ion, a trivalent iron ion or a trivalent chromium ion, $A^{n-}$ is $HCO_3^-$, $CO_3^{2-}$ or $OH^-$, and x, y and m each are $0.1<x<0.5$, $0.1<y<0.4$ and $0 \leq m<1$.

2. The method according to claim 1 wherein said phenol is selected from the group consisting of phenol, o-cresol, m-cresol, p-cresol, t-butyl phenol, 2, 4-dimethyl phenol, 2, 6-dimethyl phenol and mixtures thereof.

3. The method according to claim 1 wherein said unsaturated cyclic hydrocarbon compound is selected from the group consisting of Diels-Alder reaction products of butadiene, isoprene, piperylene, cyclopentadiene methyl cyclopentadiene and mixtures thereof.

4. The method according to claim 3 wherein said Diels-Alder reaction product is selected from the group consisting of

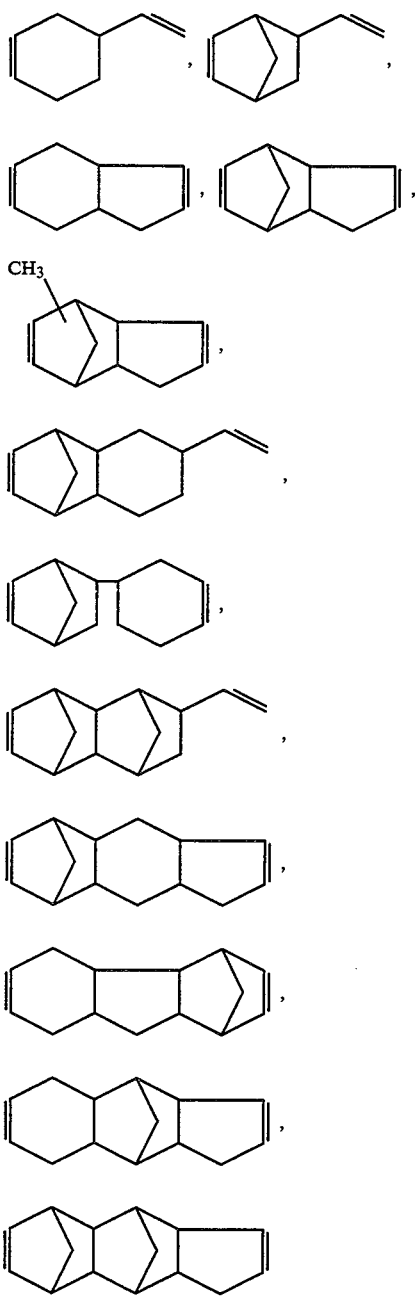

and mixtures thereof.

5. The method according to claim 1 wherein a charging ratio of said phenol is 0.8 to 12 mol equivalents relative to the unsaturated polycyclic hydrocarbon compound.

6. The method according to claim 1 wherein said acid catalyst is selected from the group consisting of boron trifluoride, ether complexes of boron trifluoride, water complexes of boron trifluoride, amine complexes of boron trifluoride, phenol complexes of boron trifluoride, alcohol complexes of boron trifluoride, aluminum trichloride, diethyl aluminum monochloride, iron chloride, titanium tetrachloride, sulfuric acid, hydrogen fluoride, trifluoromethane sulfonic acid and mixtures thereof.

7. The method according to claim 6 wherein said phenol complex of boron trifluoride is present in an amount of 0.1 to-20 parts by weight to 100 parts by weight of the unsaturated cyclic hydrocarbon compound.

8. The method according to claim 1 wherein said acid catalyst is a boron trifluoride phenol complex and wherein said phenol is reacted with said unsaturated polycyclic hydrocarbon compound at 20° to 70° C.

9. The method according to claim 1 wherein said unsaturated cyclic hydrocarbon compound is progressively added to said phenol.

10. The method according to claim 1 wherein said hydrotalcite compound is present in an amount by weight of 0.5 to 10 times that of the acid catalyst and is selected from the group consisting of Mg$_{0.7}$Al$_{0.3}$(OH)$_{2.3}$.0.5H$_2$O, Mg$_{0.67}$Al$_{0.33}$(OH)$_{2.33}$.0.52H$_2$O, Zn$_{0.75}$Al$_{0.25}$(OH)$_2$(CO$_3$)$_{0.125}$.0.5H$_2$O, Mg$_{0.7}$Al$_{0.3}$(OH)$_2$(CO$_3$)$_{0.15}$.m-H$_2$O, where $0.46 \leq m \leq 0.54$ and mixtures thereof.

11. The method according to claim 1 wherein processing by said hydrotalcite compound is at a processing temperature of 10° to 150° C. and for a reaction time duration of 10 minutes to 10 hours.

12. The method according to claim 1 wherein the hydrotalcite compound is present in an amount by weight of 0.5 to 10 times that of the acid catalyst.

13. The method according to claim 1 wherein said phenolic resin represented by the formula (1) is selected from the group consisting of

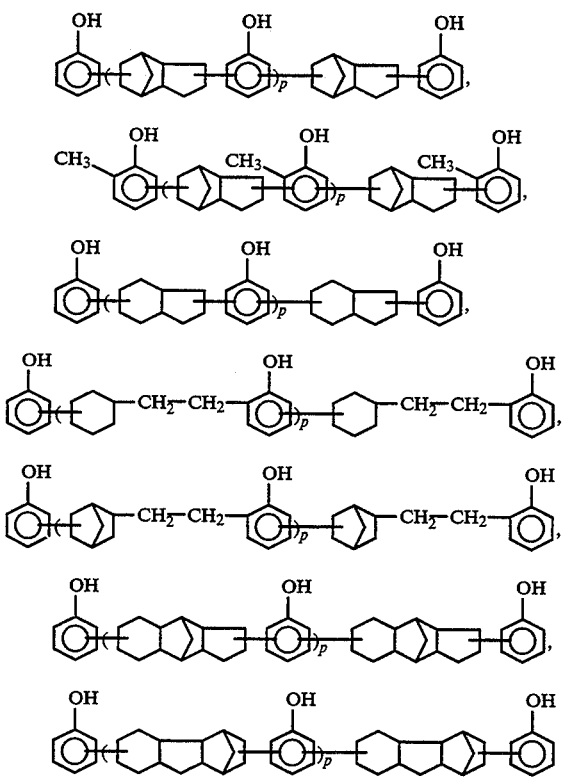

where p is a number from 0 to 10, and mixtures thereof.

* * * * *